United States Patent
Kuang

(10) Patent No.: US 6,313,989 B1
(45) Date of Patent: Nov. 6, 2001

(54) FIXING DEVICE FOR FAN OF COMPUTER

(75) Inventor: Yen Kuang, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 09/631,675

(22) Filed: Aug. 3, 2000

(51) Int. Cl.⁷ ....................................................... H05K 7/20
(52) U.S. Cl. .......................... 361/695; 361/690; 361/694; 174/16.1; 174/52.1; 165/104.33; 211/80; 211/81; 454/184; 24/231.9
(58) Field of Search .................................... 361/687, 690, 361/694, 695, 692; 257/721, 712, 727; 174/16.1; 165/80.2, 80.3; 211/77, 168, 80, 81, 169; 454/184; 24/231.9; 248/222.52

(56) References Cited

U.S. PATENT DOCUMENTS

| 5,337,994 | * | 8/1994 | Vipond et al. | 248/289.1 |
| 5,969,941 | * | 10/1999 | Cho | 361/687 |
| 6,002,586 | * | 12/1999 | Chen et al. | 361/695 |
| 6,061,237 | * | 5/2000 | Sands et al. | 361/695 |
| 6,171,062 | * | 1/2001 | Bucher et al. | 416/244 R |
| 6,186,889 | * | 2/2001 | Byrne | 454/184 |

FOREIGN PATENT DOCUMENTS 0 823 556-A2 * 11/1998 (EP) .

* cited by examiner

*Primary Examiner*—Leo P. Picard
*Assistant Examiner*—Boris L. Chervinsky
(74) *Attorney, Agent, or Firm*—Birch, Stewart, Kolasch & Birch, LLP

(57) ABSTRACT

The present invention provides a device for fast fixing a heat dissipation fan of computer on the computer case. The device includes a bracket formed with a plurality of through holes for mounting the fan. The bracket includes two ears to be inserted into two holes furnished on the computer case to make the bracket pivotal on the ears while the ears are inserted in the holes. A hole is formed on a side of the bracket opposite to the ears for fastening the bracket by a screw passing through and fixing to the computer case.

6 Claims, 3 Drawing Sheets

FIXING DEVICE FOR FAN OF COMPUTER

BACKGROUND OF THE INVENTION

1. Field of Invention

The present invention relates to a device for fixing the heat dissipation fan of a computer, and more particularly relates to a fixing device for a fan of a computer in which the fan can be easily and quickly fixed to the case of computer.

2. Related Art

As the fast development of computer technology, functions of computers are being improved, while the size thereof are decreased. A plenty of devices, such as data storage devices of magnetic or optical disk drivers, and at least a heat dissipation fan, have to be incorporated into a small space. The fan is rather important since a great amount of heat will be generated by the computer hardwares under high speed operation. The conventional manner for installing a fan is to use a plurality of screws. A lot of screws used for installations of the fan and other devices cost much time and money. The small pieces of screws are also easy to lose and inconvenient to use.

SUMMARY OF THE INVENTION

In order to solve the aforesaid problem, the present invention provides a device for fixing heat dissipation fan of a computer. The fixing device for fan of computer uses only a screw to fast fix the fan on the computer case, and saves assembly time.

To achieve the aforesaid object, a device for fixing a heat dissipation fan of computer according to the present invention mainly includes a bracket formed with a plurality of through holes for mounting the fan. The bracket includes two ears to be inserted into two holes furnished on the computer case to make the bracket pivotal on the ears while the ears are inserted in the holes. A hole is formed on a side of the bracket opposite to the ears for fastening the bracket by a screw passing through and fixing to the computer case.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

Figure 1:
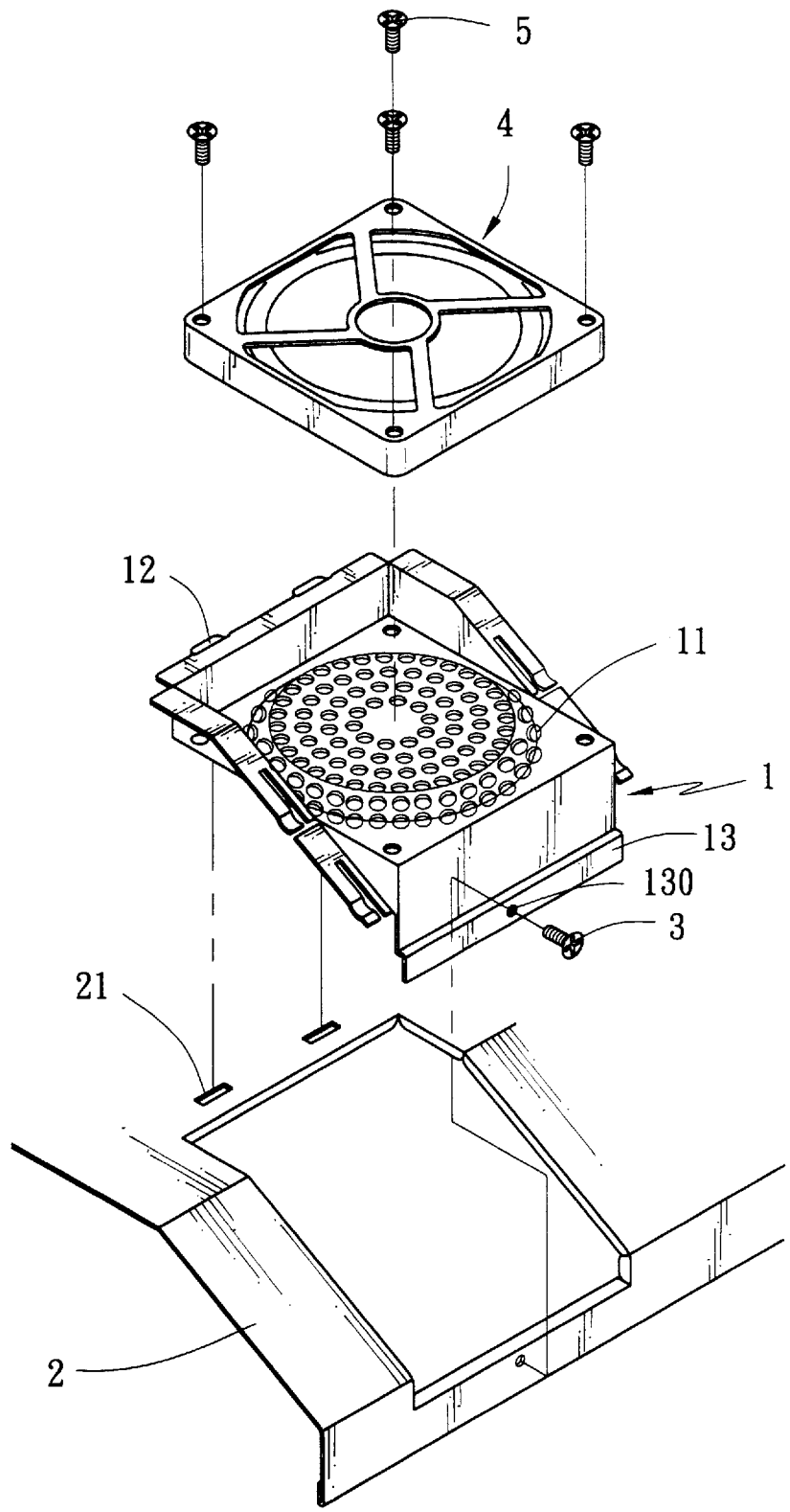
FIG. 1 is an exploded view of a fixing device for a computer fan according to the present invention.

As shown in FIG. 1, a device for fixing a heat dissipation fan 4 of computer according to the present invention mainly includes a bracket 1 formed with a plurality of through holes 11. In this embodiment, the fan 4 is mounted upon the bracket 1 and exposed outside the computer case 2. The bracket 1 includes two ears 12 to be inserted into two holes 21 furnished on the computer case 2 to make the bracket 1 pivotal on the ears 12. A rim 13 of the bracket 1 on a side opposite to the ears 12 is formed with a hole 130 for fastening the bracket 1 by a screw 3 passing through and fixing to the computer case 2. The area of the through holes 11 formed on the bracket 1 are made to be large enough to cover the air outlet of the fan 4 for an easy air flow. But, on the other hand, the bracket 1 is made of metal, and the through holes 11 are tight enough to prevent electromagnetic emissions passing through the bracket 1 and the computer case 2. In order to ensure a good contact between the bracket 1 and the computer case 2, a plurality of resilient portions 14 are formed on sides of the bracket. Therefore, after assembly of the bracket 1 to the computer case 2, the two elements electrically contact to achieve the function of preventing interference of electromagnetic emissions.

Figure 2A:
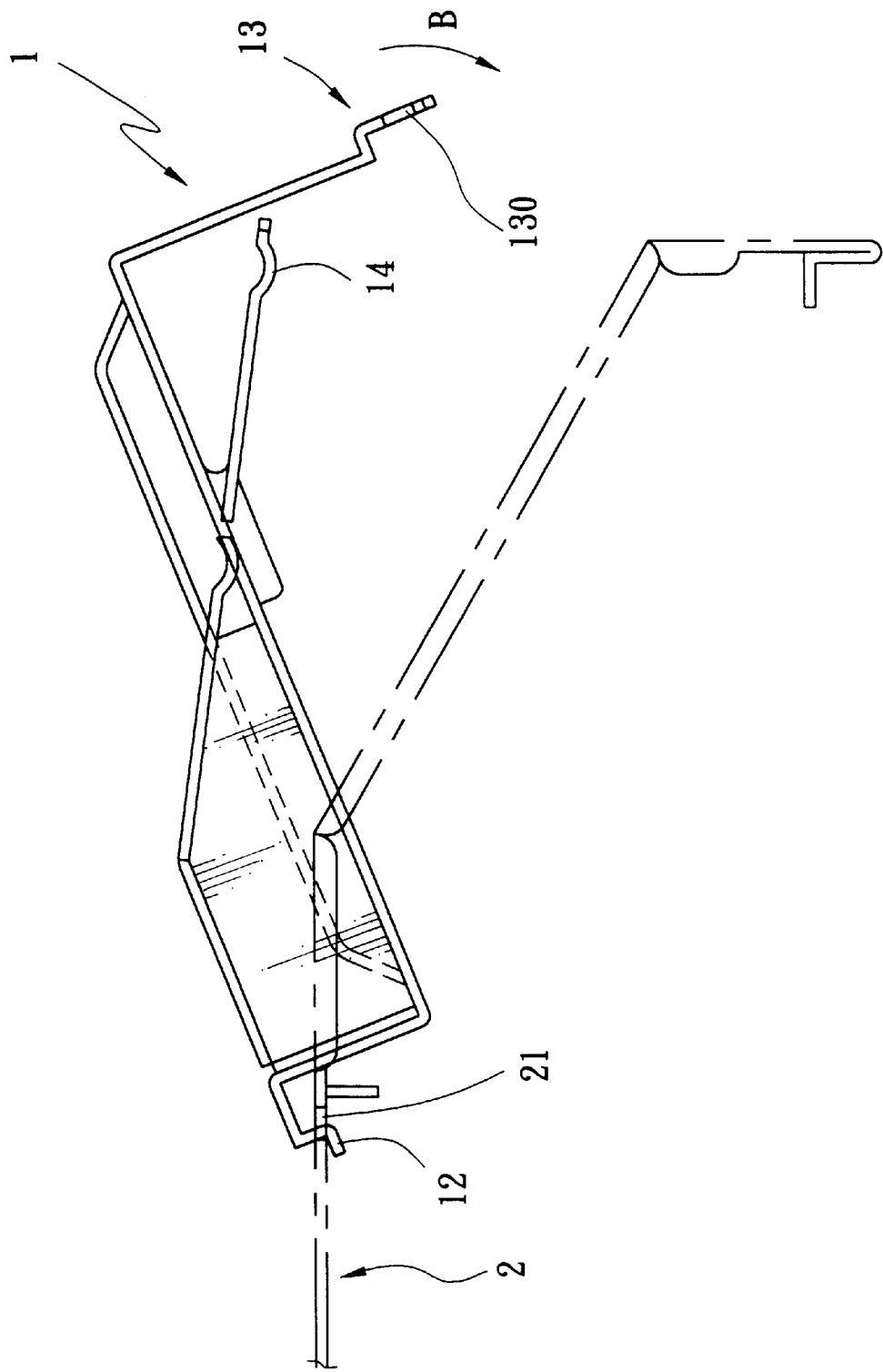
FIG. 2A is a side view of the present invention showing ears of the bracket being inserted into holes of the computer case.
Figure 2B:
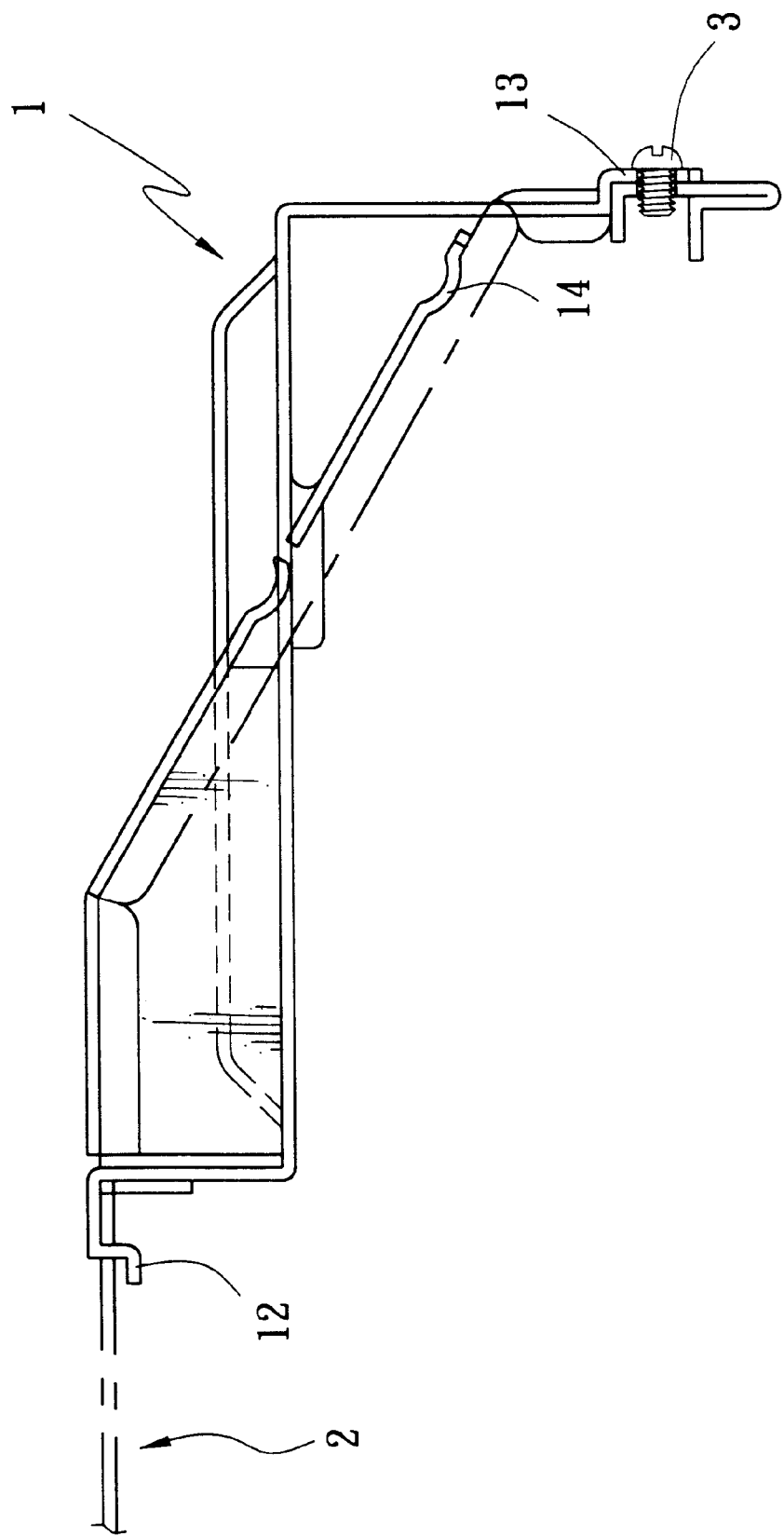
FIG. 2B is further a side view of the present invention showing the bracket being fixed to the computer case by a screw.

The procedures for mounting the bracket 1 on the computer case 2 are shown in FIGS. 2A and 2B. First, the fan 4 is fastened on the bracket 1 by a plurality of plastic rivets 5 or other fasteners. Then, the bracket 1 with fan 4 is inserted, in a suitable angle, with ears 12 into holes 21 of the computer case 2, and turned as shown by arrow B to a predetermined position and fastened by a screw 3 to the computer case 2.

In conclusion, the fixing device for a fan of computer according to the present invention has at least the following advantages:

1) only a screw is needed for fastening the bracket, therefore, it is easy to assemble and disassemble;

2) the assembly of fan and bracket can be prepared before a major assembly line to save the assembly time.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A device for fixing a fan to a computer case comprising: a bracket for mounting thereon the fan, the bracket includes two ears to be inserted into two holes furnished on the computer case to make the bracket pivotal on the ears while the ears are inserted in the holes; a hole is formed on a side of the bracket opposite to the ears; and a fastener for fastening the bracket through the hole to the computer case.

2. A device for fixing a fan of computer as recited in claim 1 wherein the bracket is formed with a plurality of through holes for air of the fan to pass through.

3. A device for fixing a fan of computer as recited in claim 2 wherein the through holes on the bracket covers a wide enough area for the air to easily pass.

4. A device for fixing a fan of computer as recited in claim 2 wherein the bracket is made of metal.

5. A device for fixing a fan of computer as recited in claim 4 wherein the bracket is formed with a plurality of resilient portions on sides thereof so as to electrically contact with the computer case after assembly and to prevent interference of electromagnetic emissions.

6. A device for fixing a fan of computer as recited in claim 1 wherein the fan is fixed to the bracket by a plurality of rivets.

* * * * *